SILICON PHOTOELECTRIC CELL

Filed Dec. 14, 1959

INVENTORS:
MOSHE Y. BEN-SIRA
BARUCH PRATT
BY
Angus & Moon
ATTORNEYS.

United States Patent Office 3,053,926

Patented Sept. 11, 1962

3,053,926

SILICON PHOTOELECTRIC CELL

Moshe Y. Ben-Sira and Baruch Pratt, Los Angeles, Calif., assignors to International Rectifier Corporation, El Segundo, Calif., a corporation of California Filed Dec. 14, 1959, Ser. No. 859,375
5 Claims. (Cl. 136—89)

This invention relates to silicon photo-electric cells, and has for its object to improve the efficiency of such cells.

Solar cells, or photo-electric converters, are well known. A common form of such a cell comprises a semiconductor material in the form of a wafer of N-type silicon having diffused into a side thereof a doping material of a kind which creates a thin surface layer of P-type silicon. This creates a P-N junction at the region of this surface. The action of light directed on such a surface creates a voltage in the region of the junction in a well-known manner. In order to utilize the voltage thus generated, contact is made to the P-type silicon surface layer and another contact is made to the N-type silicon. This has commonly been done by attaching or depositing a terminal strip of conductive metal on the surface of the P-type layer, and a similar metallic terminal strip on the opposite or base side of the N-type silicon. Terminal leads or members were then soldered to terminal strips to constitute the two terminal leads of the cell.

For the purpose of allowing light, such as solar radiation, impinging on the P-type surface of the cell to be most effective, it is desired to have the P-type layer as thin as possible. But since the current of the cell flows through this extremely thin P-type layer to the terminal strip, the P-type layer imposes undesirably high resistance which tends to lower the efficiency of the cell.

In accordance with the present invention, we improve the efficiency of such a photovoltaic cell by applying a thin metallic collector on the thin P-type surface of a wafer of N-type silicon comprised in the cell. It has been found that in the case of an unusually thin surface layer, for example about .5 to 5 microns in thickness, which would otherwise incur a reduction of efficiency on account of its resistance, application of the thin collector to this thin surface layer in accordance with the present invention, increases the efficiency of the cell far beyond that of such a cell which is not provided with the collector.

The thin collector can be applied by alloying or evaporating or sputtering or otherwise depositing the metal of the collector on the thin surface layer; and the geometry of the thin metallic collector can be made of a desired form.

Figure 1:
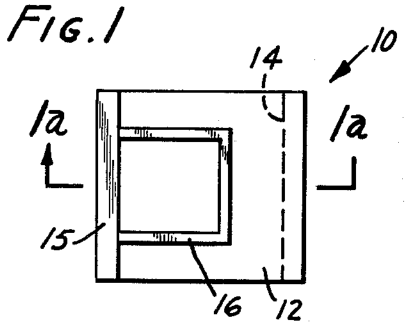
Figure 2:
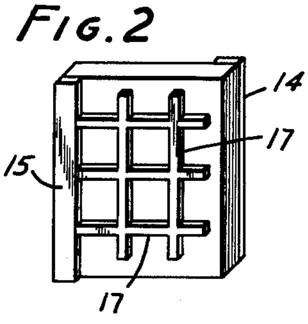
Figure 1A:
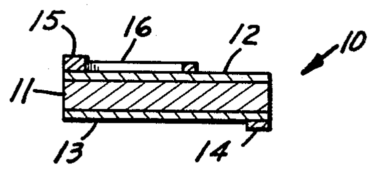

The foregoing and other features of the invention will be better understood from the following detailed description and the accompanying drawing of which:

FIG. 1 is a plan view of a solar cell provided with a collector in accordance with this invention;

FIG. 1*a* is a cross-section view taken at line 1*a*—1*a* of FIG. 1;

FIG. 2 is an isometric view of a solar cell provided with another form of collector according to this invention; and FIGS. 3, 4, 5, 6 and 7 are plan views of solar cells provided with other different arrangements of collector in accordance with this invention.

FIGS. 1 and 1*a* show a solar cell 10 of a known type comprising silicon semiconductor crystal 11. According to a well known form of such a solar cell, the silicon in this instance is selected as the N-type conductivity, and there is diffused into its surface a doping material which has the effect of making this diffused layer 12 of the P-type conductivity silicon. The P-type layer 12 should be extremely thin for purposes of good photo-electric energy conversion; for example about .5 to 5 microns, which is what is meant by the term "extremely thin" herein. Suitable doping materials for creating P-type silicon at the surface are boron, aluminum, gallium, and indium. When boron is used, for example, the boron diffusion can effectively be carried out in a well-known manner by application of boron trichloride to the silicon surface at a high temperature, for example, around 1000° C. After application of the boron, all the surfaces are then preferably cleaned thoroughly, as by treatment with concentrated nitric acid. If the doping treatment has been applied to all surfaces of the wafer so that there is a P-layer on all surfaces, then this P-layer will ordinarily be removed as by lapping or grinding, or mechanical abrasion from all surfaces except surface 12. The base of the wafer opposite the P-type layer is commonly coated with a nickel coating 13 which can be done in a well-known manner, for example, by masking the surfaces of the wafer which are not to be nickel coated and then immersing in an electrodeless nickel-plating solution. The nickel can then be coated with solder for the purpose of making contact; or alternatively a terminal strip 14 can be formed on the nickel coating 13; and such terminal strip, if used, is preferably a metal whose temperature characteristic substantially matches that of silicon. It may, for example, be an alloy containing iron and nickel with or without other metal; or a nickel plating coated with tin.

For the purpose of attaching a terminal strip on the P-type surface 12, there is provided a strip 15 of a suitable metal, preferably aluminum, such as an aluminum wire, which may conveniently be about a millimeter in diameter and of a length about equal to the side of the wafer along which it lies.

While the contact members 14 and 15 are held against their respective sides of the silicon wafer, for example in a jig, heat is applied to a sufficiently high temperature to produce a sintering of the metals of the contact strips to each other and to the adjacent surfaces of the solar cell. A temperature of about 800° C. is satisfactory for this purpose. A non-oxidizing atmosphere, such as a hydrogen atmosphere, is preferred during this heating period.

At the region of the P-type layer 12 there will be created by this heat treatment an alloy of silicon and aluminum where the aluminum of the terminal strip 15 diffuses into the silicon with which it is in contact. This will securely attach the aluminum strip 15 to the layer 12. Furthermore, the strip 14 will become firmly secured to the nickel coating 13 by diffusion and consequent alloying, thus producing at the strip 14 an alloy of silicon and the metal present in the strip 14.

A collector strip 16 attached to the P-type layer 12 makes contact with the terminal strip 15. The collector strip is a very thin metallic strip which can be applied by alloying or by evaporating or by sputtering or otherwise depositing it on the P-type surface in a manner to cause it to adhere thereto. In case of alloying, the strip 16 should be of a group III metal, for example aluminum, for application to the P-type surface 12. The metal of a strip 16 can be alloyed, for example by placing it as a thin foil on the surface 12 and in contact with member 15, prior to the heat treatment mentioned above for attaching there strips 14 and 15. Under the heat treatment, the metal of strip 16 will become alloyed to the P-type silicon surface and to the terminal strip 15 where it meets the terminal strip.

If an evaporation or sputtering process is used, the silicon wafer may be placed in a vacuum enclosure and masked except for the region to be coated with the strip 16, after which the metal to constitute the strip 16 may be evaporated or sputtered onto the surface 12.

Figure 3:
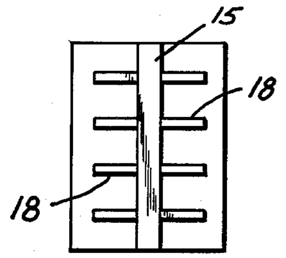
Figure 4:
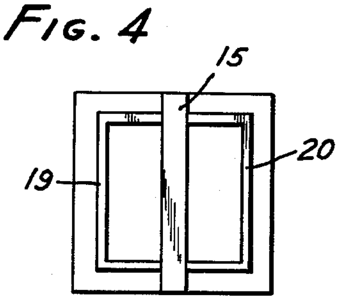
Figure 5:
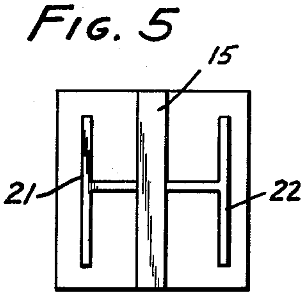
Figure 6:
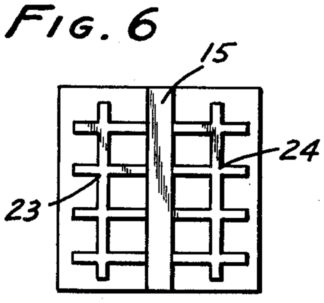
Figure 7:
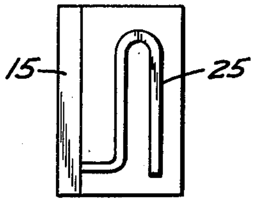

The collector strip may conveniently be about five to ten mils in width and about one to five mils in thickness, which is what is meant by the term "very thin" herein. The geometry of the metallic collector 16 is shown as comprising three sides of a square or rectangle in FIG. 1. It may however have some other geometrical configuration which will depend somewhat on the dimension and shape of the wafer. For example, in FIG. 2 the collector strip is shown as a grid 17 in contact with terminal strip 15. In FIG. 3 the collector is shown in the form of a plurality of parallel strips 18 spaced apart and in contact with the terminal strip 15. In FIG. 4 the collector is shown as a pair of rectangles 19 and 20 meeting at the terminal strip 15. In FIG. 5 the collector is shown as a pair of T's 21 and 22, the legs of which are joined to the terminal strip 15. FIG. 6 shows an arrangement in which collectors 23 and 24 are arranged on opposite sides of the member 15. FIG. 7 shows an arrangement in which the collector 25 is in the form of a loop on the P-type surface.

It will be recognized that in the drawings the relative thicknesses of parts and layers does not necessarily bear any relation to actual proportions; and many of the layers and parts are shown with exaggerated thickness for purposes of illustration.

In the embodiments described above, the photo-electric cells were considered to be of the usual construction of an N-type silicon wafer with the extremely thin P-type surface layer at which the energy conversion occurs. The possibility is present of using a P-type silicon wafer instead of the N-type wafer; and in the case of the use of a P-type wafer, the extremely thin surface layer should then be of the N-type to create the P-N junction. If the surface layer be N-type, the metal of the collector in case of alloying should be metal of group V of the periodic table or alloys thereof, for example antimony; and the terminal strip 15 should also be metal from group V.

It will be recognized that by our invention, we have provided a simple arrangement of a silicon photo-electric converter having an extremely thin surface layer of silicon of the opposite conductivity type from that of the main silicon wafer such that the surface layer acting as its own collector imposes substantial resistance to current flow, together with a collector in the form of a very thin layer of metal of group III for use on a P-type surface layer, or of group V for use on an N-type surface layer. Since the high conductivity of the collector strip permits ready passage of the current of the surface layer of silicon to the terminal strip, the arrangement results in a high efficiency photo-cell even though the surface layer of the silicon be very thin.

The invention is not limited to the particular embodiments illustrated and described herein, which are given by way of illustration rather than of limitation, and the invention is not limited except in accordance with the appended claims.

What is claimed is:

1. A photo-electric cell comprising a wafer of silicon of N-type conductivity with an extremely thin P-type surface layer of less than about five microns thickness, a single contact strip operable to receive an electrical terminal attached to the P-type surface layer, and a conductive collector strip means adherent to the P-type layer and in contact with said contact strip; said collector strip being a metal of group III and less than about five mils in thickness; the cross-sectional area of said collector strip being substantially smaller than the cross-sectional area of said contact strip, said collector strip having a width substantially less than the width of the surface of said wafer in any direction; and a second electrical terminal; said second electrical terminal being electrically connected to the N-type conductivity type portions of said wafer.

2. A photoelectric cell according to claim 1 in which the width of the collector strip is less than about ten mils.

3. A photoelectric cell according to claim 1 in which the collector strip is a grid of strips.

4. A photo-electric cell comprising a wafer of silicon of one of the conductivity types with an extremely thin surface layer of the opposite conductivity type and of less than about 5 microns in thickness, a contact strip operable to receive an electrical terminal attached to the surface layer, and a conductive collector strip means adherent to the surface layer, said collector strip having a thickness of less than five mils; the cross-sectional area of said conductive collector strip being substantially smaller than the cross-sectional area of said contact strip, said collector strip having a width substantially less than the width of the surface of said wafer in any direction.

5. A photoelectric cell according to claim 4 in which the width of the collector strip is less than about ten mils.

References Cited in the file of this patent

UNITED STATES PATENTS

| | | |
|---|---|---|
| 2,406,139 | Fink et al. | Aug. 20, 1946 |
| 2,537,255 | Brattain | Jan. 9, 1951 |
| 2,537,256 | Brattain | Jan. 9, 1951 |
| 2,780,765 | Chapin et al. | Feb. 5, 1957 |
| 2,786,880 | McKay | Mar. 26, 1957 |
| 2,794,846 | Fuller | June 4, 1957 |
| 2,861,909 | Ellis | Nov. 25, 1958 |
| 2,873,303 | Rittner | Feb. 10, 1959 |

OTHER REFERENCES

Prince: Journal of Applied Physics, Vol. 26, No. 5, pp. 534–540, May 1955.